US006849480B1

(12) United States Patent
Low et al.

(10) Patent No.: US 6,849,480 B1
(45) Date of Patent: Feb. 1, 2005

(54) SURFACE MOUNT IC STACKING METHOD AND DEVICE

(75) Inventors: Chau Chin Low, Freemont, CA (US); Oscar Woo, Santa Cruz, CA (US); Michael R. Fabry, Apple Valley, MN (US); Terry A. Junge, Scotts Valley, CA (US); Tiang Fee Yin, Singapore (SG); Choon An Aw, Singapore (SG); Jonathan E. Olson, Minneapolis, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 552 days.

(21) Appl. No.: 09/427,226

(22) Filed: Oct. 26, 1999

Related U.S. Application Data

(60) Provisional application No. 60/133,019, filed on May 7, 1999.

(51) Int. Cl.[7] .................. H01L 21/44; H01L 21/48; H01L 21/50; H01L 21/28; H01L 21/3205
(52) U.S. Cl. ..................................... 438/109; 438/601
(58) Field of Search ............................ 438/109, 601; 29/729, 757, 760

(56) References Cited

U.S. PATENT DOCUMENTS

| | | | |
|---|---|---|---|
| 5,311,401 A | 5/1994 | Gates, Jr. et al. | |
| 5,313,096 A | 5/1994 | Edie | |
| 5,325,268 A | 6/1994 | Nachnani et al. | |
| 5,334,875 A | 8/1994 | Sugano et al. | |
| 5,346,402 A | 9/1994 | Yashuo et al. | |
| 5,362,984 A | 11/1994 | Konda et al. | |
| 5,373,188 A | 12/1994 | Michii et al. | |
| 5,380,681 A | 1/1995 | Hsu | |
| 5,382,827 A | 1/1995 | Wang et al. | |
| 5,422,435 A | 6/1995 | Takiar et al. | |
| 5,432,729 A | 7/1995 | Carson et al. | |
| 5,441,918 A | 8/1995 | Morisaki et al. | |
| 5,466,634 A | 11/1995 | Beilstein, Jr. et al. | |
| 5,475,262 A | 12/1995 | Wang et al. | |
| 5,479,051 A | 12/1995 | Waki et al. | |
| 5,484,959 A | 1/1996 | Burns | |
| 5,490,041 A | 2/1996 | Furukawa et al. | |
| 5,514,907 A | 5/1996 | Moshayedi | |
| 5,581,498 A | 12/1996 | Ludwig et al. | |
| 5,612,570 A | 3/1997 | Eide et al. | |
| 5,629,563 A | 5/1997 | Takiar et al. | |
| 5,723,901 A | 3/1998 | Katsumata | |
| 5,748,452 A | 5/1998 | Londa | |
| 5,768,772 A | * | 6/1998 | Buechele ..................... 29/830 |
| 5,783,870 A | 7/1998 | Mostafazadeh et al. | |
| 5,786,237 A | 7/1998 | Cockerill et al. | |

(List continued on next page.)

OTHER PUBLICATIONS

IEEE 100: the authoritative dictionary of IEEE standards Terms, IEEE, 7th ed., 2000, pp. 166, 570, 787.*
Harper, Charles A., "Electronic Packaging, Microelectronics, and Interconnection Dictionary," 1993, p. 32.*

*Primary Examiner*—Carl Whitehead, Jr.
*Assistant Examiner*—Nema Berezny
(74) *Attorney, Agent, or Firm*—Derek J. Berger

(57) ABSTRACT

Packaged surface mount (SMT) chips having matched top contacts and bottom contacts are stacked. Chip features are selected to provide the desired connectivity between chip layers with a greater ease of manufacture. In one embodiment, additional spacing and routing layers are optionally provided between layers. In another, chips are differentiated by optionally providing different conductor and/or nonvolatile cell configurations. In yet another, a minority of a substrate's contacts are configured for aligning with a dielectric region of a spacing layer or substrate to create very low capacitance signal paths between stacked chips.

13 Claims, 16 Drawing Sheets

U.S. PATENT DOCUMENTS

| | | |
|---|---|---|
| 5,801,439 A | 9/1998 | Fujisawa et al. |
| 5,818,748 A | 10/1998 | Bertin et al. |
| 5,838,060 A | 11/1998 | Comer |
| RE36,077 E | 2/1999 | Michii et al. |
| 5,892,287 A | 4/1999 | Hoffman et al. |
| 5,910,682 A | 6/1999 | Song |
| 5,910,685 A | 6/1999 | Watanabe et al. |
| 5,915,167 A | 6/1999 | Leedy |
| 5,998,864 A | 12/1999 | Khandros et al. |
| 6,033,931 A | 3/2000 | Hoffman et al. |
| 6,072,234 A | 6/2000 | Camien et al. |
| 6,117,704 A | 9/2000 | Yamaguchi et al. |
| 6,157,541 A | 12/2000 | Hacke |
| 6,168,969 B1 * | 1/2001 | Farnworth .................. 438/106 |
| 6,172,874 B1 | 1/2001 | Bartilson |
| 6,195,268 B1 | 2/2001 | Eide |

* cited by examiner

SURFACE MOUNT IC STACKING METHOD AND DEVICE

RELATED APPLICATIONS

This application claims the benefit of U.S. Provisional Application No. 60/133,019 filed on May 7, 1999.

FIELD OF THE INVENTION

The present invention relates generally to methods and devices for increasing the density of integrated circuits (IC's) placed on a substrate such as a printed circuit board (PCB), and more particularly to methods and devices for stacking chips comprising surface mount technology (SMT) chip packages.

BACKGROUND OF THE INVENTION

For several years, makers of electronic and electromechanical systems have known that IC stacking methods and stacked devices can sometimes allow more components to be mounted in a given area of a substrate. For example, U.S. Pat. No. 5,612,570 (filed Apr. 13, 1995 by Eide et al.) teaches a configuration for stacking one chip into each of several frames, and then stacking the frames. Signal routing between the chip leads and the frames is provided by traces routed through the frames.

Although many known stacking methods are capable of providing the desired PCB population density, a first problem not yet adequately addressed is that identical (or very similar) chips in a vertically aligned group have required at least as many interfaces containing routing (i.e. horizontally offset vertical conductors) as chip layers. Each alternation between a chip layer and an interface structure adds to the cost of the handling equipment required to assemble a stack.

U.S. Pat. No. 4,956,694 (filed Nov. 4, 1988 by Eide et al.) teaches a configuration for stacking slightly differing LCC chips onto a small substrate that can then be mounted sideways on a larger substrate. This stacked device relies on these slight differences between the dies to function, because exactly identical IC dies connected exactly in parallel are unable to perform logic functions individually. A second problem not yet adequately addressed in the art is that stacked device configurations of this type require that the dies be fabricated using different masks, and are subsequently maintained in distinct inventories. A need thus exists for stacked devices that can be made with dies that are fabricated identically and then made into distinct chips at a later step of manufacture.

A third problem that exists in the art is very long, high capacitance conduits typically provided between internal circuit elements on different dies. Although some prior stacking configurations incidentally reduce the length and capacitance of such conduits as compared to electrical paths comprising internal traces of a substrate, all known configurations suffer from either difficulty of manufacture or relatively poor performance.

SUMMARY OF THE INVENTION

Methods and devices are shown which can solve one or more of these problems. The present invention is useful for stacking packaged surface mount (SMT) chips featuring conductors extending to the outside of the package, the conductors each being of a type that has a top contact and a bottom contact relative to the substrate on which the stacked device is to be mounted. Top contacts of each chip in the top layer are desirably left entirely unconnected, and bottom contacts of each chip the bottom layer are desirably configured for coupling with a planar substrate surface. Preferred methods and devices of the present invention simplify manufacturing by allowing chips that must eventually be differentiated to remain substantially identical longer into the manufacturing process.

A first embodiment of the present invention provides a stacking method and device featuring simplified assembly by sandwiching any offset conductors or horizontal routing between the chips in the stack, thereby allowing a lesser number of interfaces than chip layers. This provides a mechanism for individual signal coupling so that even perfectly identical chips can be accommodated. Detailed examples are shown in FIGS. 4–12. These include specific arrangements for testing, heat sinks, singulation, and interface construction.

A second embodiment of the present invention provides a stacking method and device featuring chips configured to be vertically aligned in a stack, differentiated by providing different conductor and/or nonvolatile cell configurations. This allows commonality between all of the dies and packages to be maintained at least until the conductors are installed. Detailed examples are shown in FIGS. 12–20. These include specific arrangements for controlling substrate connectivity, accommodating dissimilar chips, accommodating identical chips, differentiating identical devices before or after stacking, and modifying chips using electrical, mechanical, or optical means.

A third embodiment of the present invention provides a stacking method and device featuring a minority of a chip's contacts configured for aligning with a dielectric region of a spacing layer or substrate. This allows very short, low capacitance signal paths between stacked chips in a very easily manufacturable configuration. Detailed examples are shown in FIGS. 5, 12, 15 & 17. These include specific arrangements for assembly, limited horizontal routing on the substrate surface, and within-chip routing.

DETAILED DESCRIPTION

Figure 1:
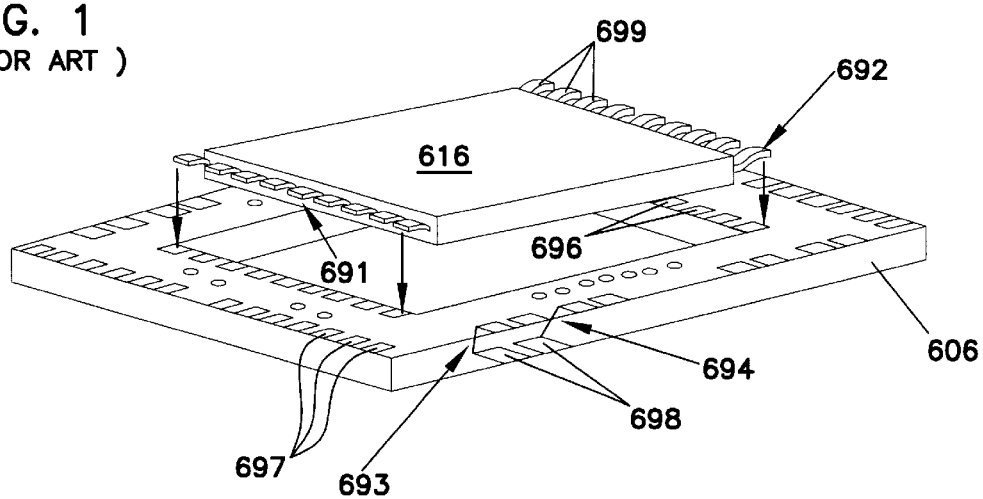
FIG. 1 shows a packaged memory chip and a routing layer of the prior art.

Although each of the many examples below shows more than enough detail to allow those skilled in the art to practice the present invention, subject matter regarded as the invention is broader than any single example below. The scope of the present invention is distinctly defined, however, in the claims at the end of this document. Definitions of many terms used in this document are provided, all consistent with common usage in the art but some described with greater specificity.

Stacked devices of the present invention are configured to be coupled to a substrate. "Top," "bottom," "upper" and the like as used herein are described with reference to the substrate that is to be "below" the stacked device, or to an arbitrarily selected "bottom" of the stacked device where the stack is to be mounted sideways.

A "conductor" is a continuous structure or material having electrical conductivity about equal to that of a metal. A "contact" is a surface of a conductor configured to touch a portion of another conductor to form a physical and electrical coupling simultaneously. The "contacts" of an IC die as used herein refer to those contacts on the exterior of the die.

"Internal circuitry" on an IC die includes resistors and active elements on the die, but excludes ordinary signal traces and fusible links connected very near to a die contact.

"Coupled directly" as used herein refers to objects that are physically touching. Two items are said to be physically coupled "indirectly" if they are both directly coupled to a third item or to a binder. Irrespective of physical coupling, two conductors are "electrically coupled" if there is a continuous conductive path between them. Two conductors are electrically coupled "internally" if they both extend within an object such as an IC package and a continuous conductive path exists between them within the object.

An IC "package" as used herein is a surface mount technology (SMT) package having a dielectric body having a cavity large enough to accommodate the die(s) for which the package was intended. It also has contacts inside the body for electrically coupling with the die(s) and contacts external to the body that are electrically coupled to the internal contacts. Packages used in the present invention each have several conductors each having matched "upper" and "lower" external contacts configured to facilitate chip stacking. Contacts of a "matched" pair residing on opposite sides of a package lead do not touch each other.

IC packages of the present invention include conventional ceramic or plastic packages for use with IC dies. The term "package" as used herein excludes components conventionally added to the inside of a package (e.g. bare dice, epoxy-coated dice, tape-based die carriers such as TAB components, and bond wires), but includes package lids and several routed conductors. Typically each conductor includes an internal contact configured to be electrically coupled to an IC die and one or more external contacts configured to be electrically coupled to a socket, a PCB pad, a jumper, or some other conductor. External contacts may include a part of the top and a part of the bottom of a gull-wing or flat pack lead, for example.

Each conventional IC package includes a dielectric body having a cavity large enough to accommodate the die(s) for which the package was intended. It also has contacts inside the body for electrically coupling with the die(s) and contacts external to the body that are electrically coupled to the internal contacts. Surface mount IC packages used in the present invention have matched, non-overlapping "upper" and "lower" external contacts to facilitate chip stacking. Conventional packages typically have a simple body shape such as a rectangular solid, outside of which leads may protrude. Two IC packages are said to be "internally identical" if the portion of the package inside the simple shape is the same, whether or not the externally protruding leads are identical.

"Internally connectable" as used herein refers to conductors and conductive contacts that are configured so that they readily could be connected to provide an internal electrical coupling. "Unconnected" as used herein refers to items that are (or were) configured to be internally connectable to a target conductor (i.e., of an IC die and/or package), but which are separated from the target by a dielectric. A "no-connect" is another art-known term describing certain bifurcated conductors and their contacts. Except for the preceding sentence, a "conductor" as used anywhere in this document means a contiguous conductor.

A "chip" as used herein refers to a package containing at least one die, the package having external contacts electrically coupled to at least some of electrically operative contacts of the at least one die.

As used herein, the term "footprint" refers to the two-dimensional plan, layout, or projected area of an element at a given plane, such as the mounting layout of the chip.

"Similar" dies as used herein include identically manufactured dies and dies having substantially all of their electrically operative contacts in common, that majority being in exactly the same sequence and in the same nominal location relative to the internal circuitry of each. "Substantially all" as used herein means at least about 90%. Thus, a package that can accommodate a complex die can virtually always accommodate a "similar" but simpler die. "Dissimilar" as used herein refers to dies that do not comply with this definition, or to chips that contain dissimilar dies.

"Substantially identical" as used herein refers to dies one of which has all of its electrically operative contacts in the same nominal location relative to its internal circuitry as those of the other die. Dies are those made from masks generated from identical data files or having all of the same structures in the same nominal arrangement are "substantially identical." Even dies differing by a contact or two may still be "substantially identical" if one can serve the intended application of the other and the differences are such that a given manufacturer-assigned product number need not change. Multiple revision numbers associated with a single product are not uncommon in the IC industry.

"Identical" as used herein refers to dies which have all of their electrically operative contacts identically configured. Manufacturing differences such as those resulting from processing variations or differences between identically-manufactured masks will not prevent two dies from being identical, provided one of them can function for the intended purpose of the other. "Different" is used herein to refer to dies that fail to meet the definition of "identical" (such as those that have modified electrical characteristics, even if they are still "substantially identical").

Two packages are deemed "identical" herein if one of them can function for the intended purpose of the other. Two packages are "internally" identical if they are identical except for the shapes of leads protruding from the package bodies. Packages can be internally identical even if the contents of the cavities differ from one another. Two packages may be "substantially" identical even if their contacts differ by a contact or two, and they are "similar" if substantially all of their electrically operative contacts have the same general arrangement in their intended application.

A package "interior" as used herein refers to the body of the package and the contents of the package cavity. These contents typically include internal contacts coupled to die contacts by a "conduit configuration." The term "conduit configuration" as used herein refers to the number of conduits placed in a package, the selection of which die and package interior contacts are to be coupled electrically by the conduits, and the approximate locations of those contacts relative to the die or package interior. Thus, a "bond map" comprising the die- and package-specific information needed by a wire bonding machine is an example of a sufficiently complete "conduit configuration," even if it lacks specific information about loop height.

An "interface" as used herein refers to a given set of the contacts on each of two entities, together with the conductors coupled to those contacts and the structural members containing those conductors outside two entities. Die interfaces as discussed herein therefore each include at least two IC packages. Chip interfaces discussed herein may comprises nothing more than a pattern of solder bonds.

FIG. 1 shows a packaged memory chip 616 and a routing layer 606 of the prior art. The packaged chip 616 has eighteen gull wing leads 699, each having a bottom contact 691 that is placed against a corresponding inner contact 696 on the routing layer 606. The routing layer 606 insulates the inner contacts 696 from each other and provides internal conductive paths to several of the outer contacts 697. Each outer contact 697 is also electrically coupled to a bottom contact 698 on the underside of the routing layer 606. Most of the outer contacts 697 couple via an "ordinary" vertical conductor 693, but a few of the outer contacts 697 couple via an "offset" vertical conductor 694.

Figure 2:
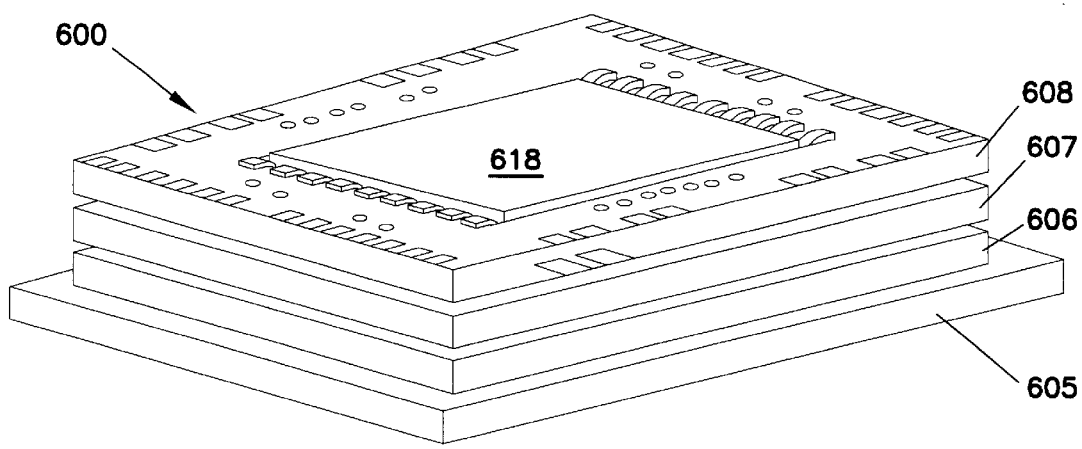
FIG. 2 shows a known stacked device comprising the chip of FIG. 1.

FIG. 2 shows a known stacked device 600 such as that taught in U.S. Pat. No. 5,612,570 mounted to a substrate 605. The device 600 is formed of several identical routing layers 606,607,608 each holding a corresponding, packaged chip 616,617,618. Each of the outer contacts 697 of bottom routing layer 606 couple directly to a corresponding bottom contact 698 on the underside the second routing layer 607. Similarly, bottom contacts 698 on the underside of the bottom routing layer 606 couple directly to contacts (not shown) on the substrate 605.

By a known surface mount stacking interface scheme combining vertical conductors 693 with offset conductors 694, each of the packaged chips 616,617,618 has "individual signal coupling"—i.e., has at least one signal path that is electrically isolated from the other packaged chips in the stacked device 600. This allows each of the packaged chips 606,607,608 to be addressed uniquely, even if identical packaged chips are used.

Figure 3:
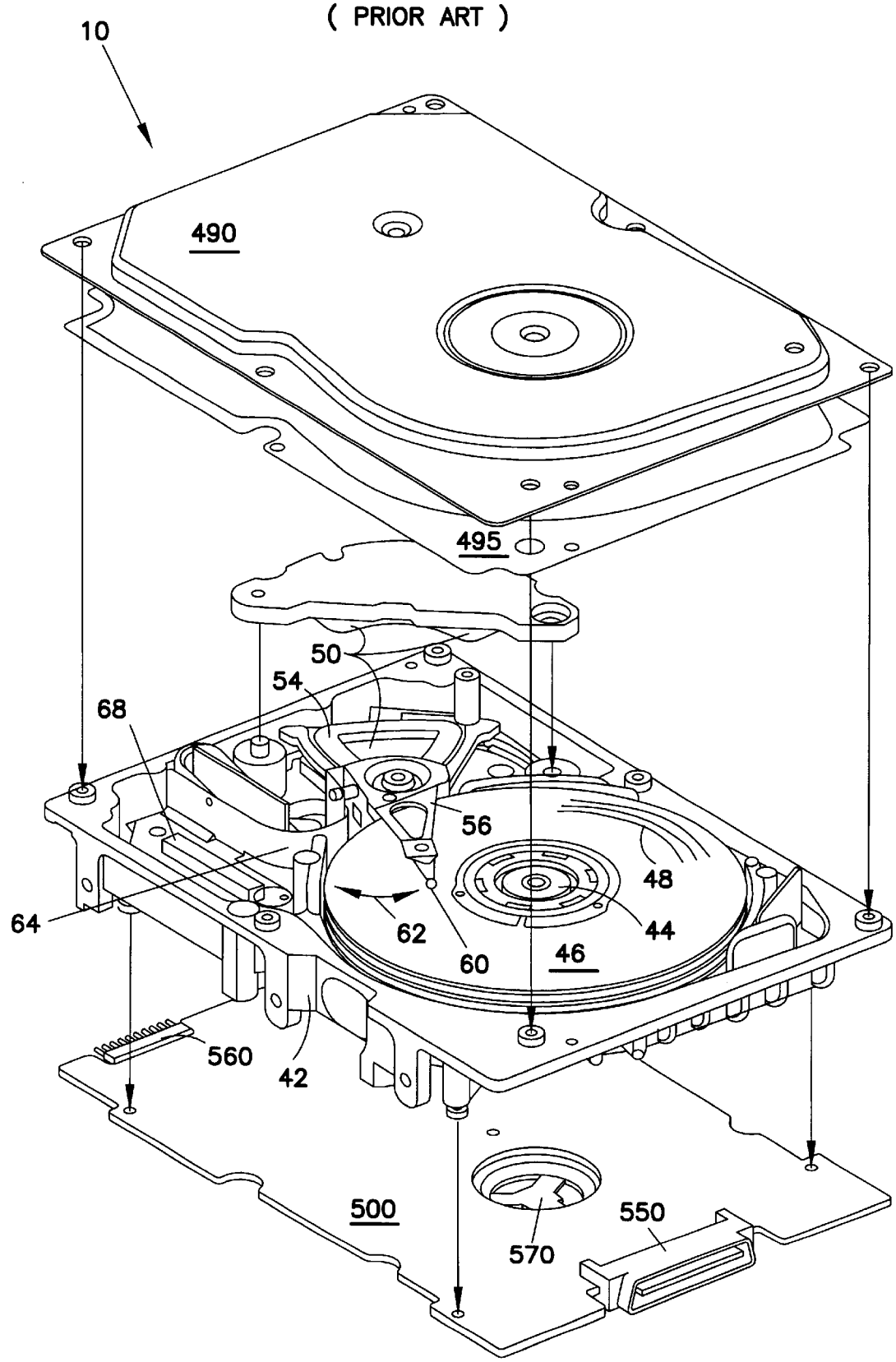
FIG. 3 shows a prior art electromechanical system having a crowded controller board of a general type that could benefit by the present invention.

FIG. 3 shows, in exploded form, Seagate's Cheetah 18LP disc drive as sold prior to this writing. As explained below, this electromechanical system requires stacked IC devices to comply with its form factor specifications. Briefly, the disc drive 10 includes a housing base 42 and a top cover 490, which engage a gasket 495 to form a sealed housing that maintains the clean environment inside the disc drive 10. A plurality of disks 46 is mounted for rotation on a spindle motor hub 44. A plurality of transducer heads 60 is mounted to an actuator body 56. The actuator body 56 is adapted for pivotal motion under control of a voice coil motor (VCM) comprising a voice coil 54 and magnets 50 to controllably move heads 60 to a desired track 48 along an arcuate path 62. Signals used to control the VCM and the heads 60 pass via a flex circuit 64 and a connector 68 to and from electronic circuitry on controller board 500. As shown, the controller board 500 comprises a fibre channel interface 550, a serial port connector 560, and a spindle connector 570. In fact, the board 500 is extremely crowded.

Figure 4:
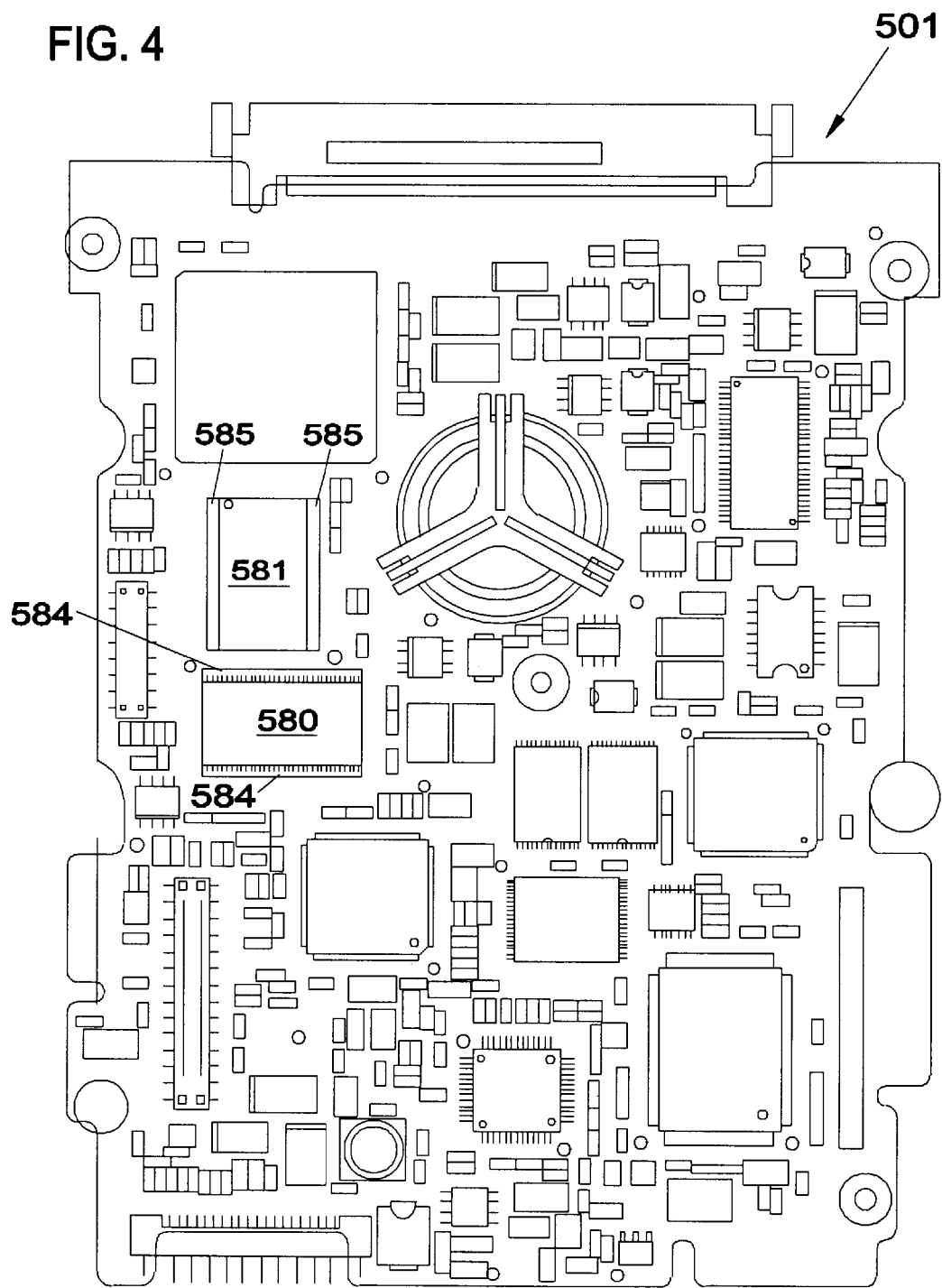
FIG. 4 shows a crowded controller board of the present invention, modified from that of FIG. 3 by the substitution of stacked devices of the present invention.

FIG. 4 shows a controller board 501 modified from the board 500 of FIG. 3 by the substitution of stacked devices 580,581 of the present invention. All of the upper external contacts of one stacked device 580 are fully exposed to air, thus making the external leads and spacing layer segments 584 beneath the leads visible. All of the upper external contacts of the other stacked device 581 are fully coated with a protective (solid) dielectric 585 such as a deposited epoxy. All of the chips shown are preferably coupled to the board 501 by a single reflow operation.

Figure 5:
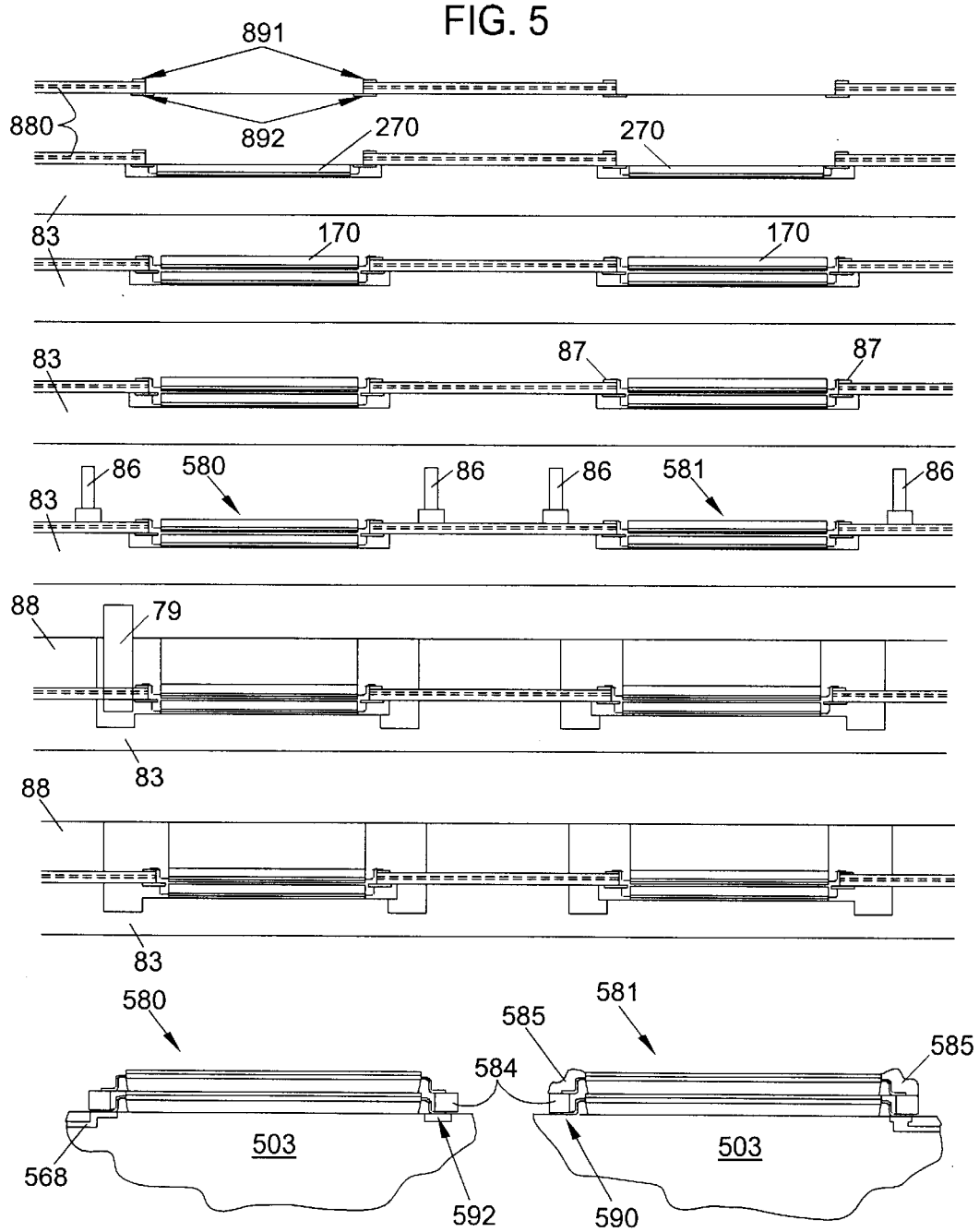
FIG. 5 shows a cross sectional view of stacked devices of the present invention in a succession of stages of manufacture.

FIG. 5 shows a cross sectional view of stacked devices of the present invention in various stages of manufacture. A spacer layer 880 such as a printed circuit board is provided with solder paste on contacts 891,892 on its opposite surfaces. After preparing the layer, at least one chip 270 is placed on a work surface 83. An assembly component comprising a spacing layer 880 is placed in contact with the leads of each chip 270. At least one more layer of chips 170 is provided so that some of its contacts couple directly to contacts 892 on the spacing layer 880 with solder 87. Electrical probes 86 are used to test which stacked devices 580,581 are functional. A clamping surface 88 is used to secure the devices while they are separated into individual units (singulated) with a cutting device 79 such as a router. The singulated devices are removed from the assembly fixture 83,88. They may then be coupled to a substrate 503 having internal conductors 568 such as by soldering to contacts 592. In one embodiment, at least one bottom contact of the stacked device couples only to a dielectric region of the substrate and all the top contacts of the top chip 270 in the stack is coated by a dielectric 585. Alternatively, at least one of the substrate contacts 592 coupled to a stacked device 580 is electrically isolated from any of the substrate's internal conductors 568.

Figure 6:
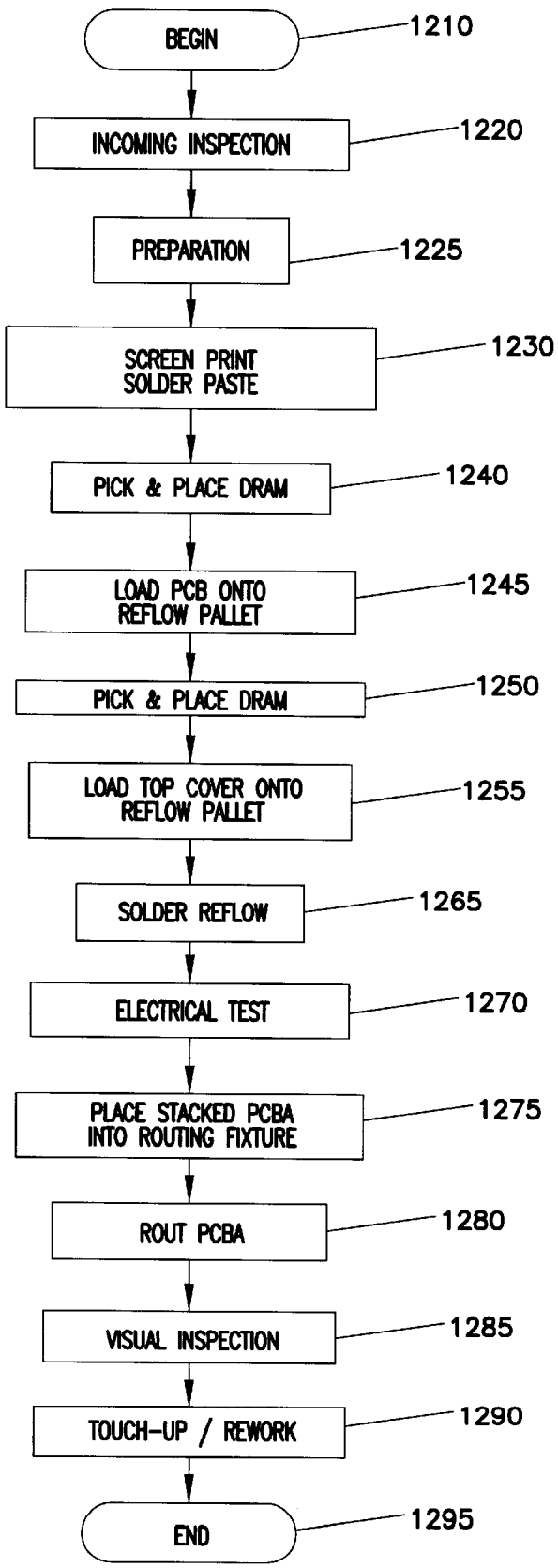
FIG. 6 shows further detail one method of the present invention, compatible with FIG. 5.

FIG. 6 shows further detail of the present inventive method compatible with FIG. 5. Printed circuit board(s) are inspected 1220 as known in the art, then prepared 1225 and screen printed with solder paste 1230. Chips are picked & first placed onto the reflow pallet 1240, then additional boards(s) and chips are placed onto the reflow pallet 1245, 1250. The top cover of the reflow pallet is placed 1255 and a reflow is performed 1265 as known in the art. The devices undergo electrical test 1270. In a preferred embodiment, step 1270 more particularly comprises a step of modifying the electrical characteristics of each of the vertically-aligned chips in the stack, or at least all but one of them. The steps are then singulated 1280 and inspected 1285 and any necessary rework is performed 1290 prior to installation onto a substrate.

Figure 7:
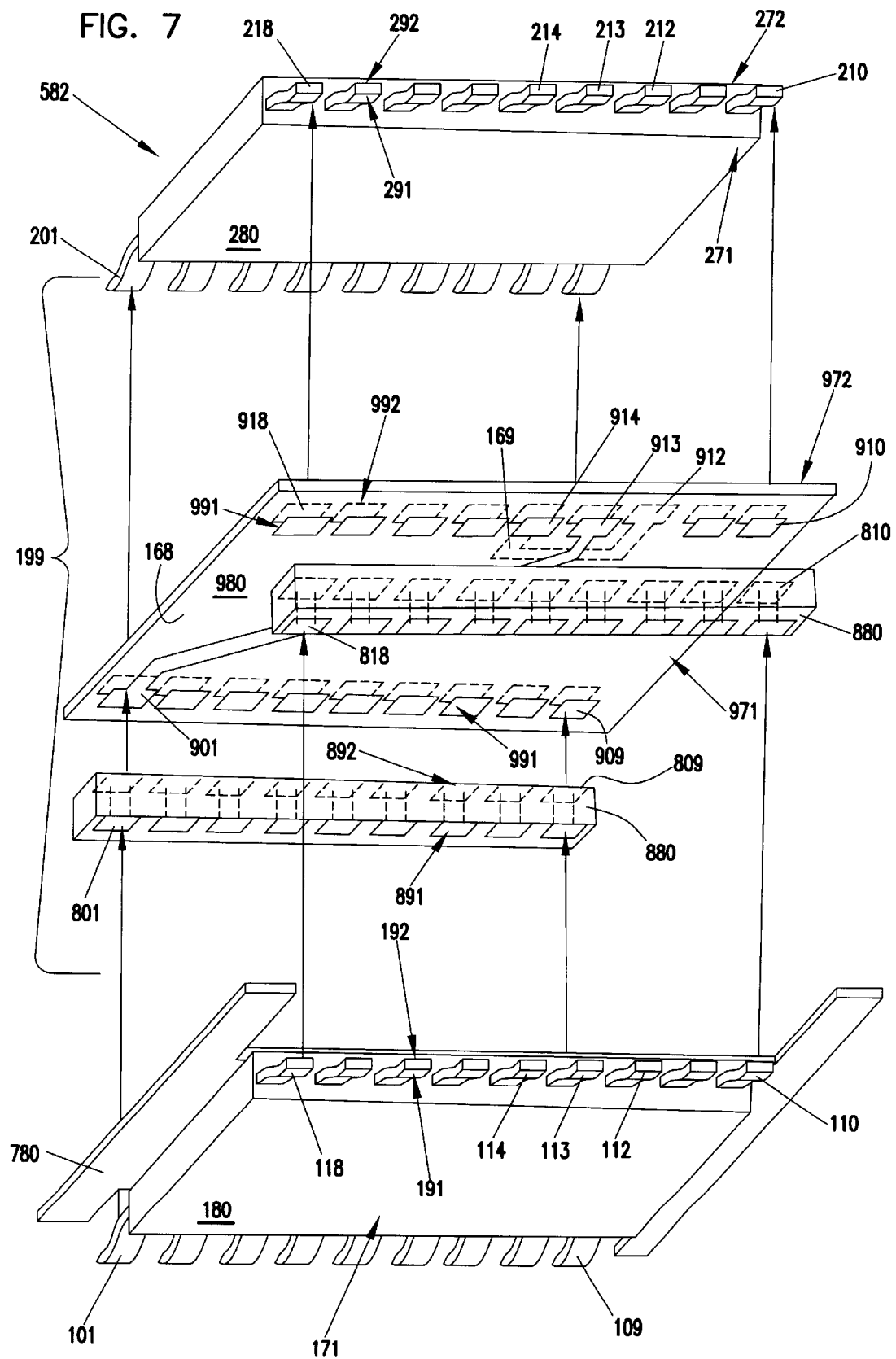
FIG. 7 shows a stacked device of the present invention in an exploded view, tilted upward to reveal the undersides of chips, the device featuring packages with gull-wing type leads and a heat sink.

FIG. 7 shows a stacked device 582 of the present invention in an exploded view, tilted upward to reveal the undersides 171,271 of leaded chips 180,280 in a stack. The bottom chip 180 is a packaged device having eighteen conductors 101–118 with gull-wing leads that protrude downward and outward. As shown, each of the conductors 101–118 has an upper contact 192 configured for direct contact with a two-piece spacing layer 880 and a lower contact 191 which may be configured for direct contact with a primary PCB (not shown).

A heat sink 780 is provided, shaped like a capital "I" with two narrow segments connected by a perpendicular segment. Optionally, it contacts the bottom chip 180 directly and is affixed there with a high temperature silicone adhesive. Although heat sinks are usually used only for larger chips, a heat sink 780 is shown with unusually small chips 180,280 for purposes of illustrative. Interface 199 comprises the depicted spacing layer 880 and offset conductor routing layer 980. According to a preferred embodiment of the present invention, a stack having L chip layers will need only (L-1) such interfaces for proper signal routing. Spacing layer 880 and routing layer 980 are desirably affixed to one another prior to assembly with the chips 180,280. Most conductors 801–818,901–918 of these layers 880,980 have contacts configured for direct coupling with a contact of the other layer, so this affixation is conveniently performed with solder paste.

As shown, a trace 168 on the bottom 971 of the routing layer 980 couples conductor 901 to conductor 913, thus coupling four package conductors 101,113,201,213. If the chips 180,280 in the stack are identical, this trace does not enable individual signal coupling to these package conductors 101,113,201,213. A trace on a routing layer having conductors adapted for coupling to conductors on two or more sides of a stacked IC package 180 nevertheless provides a novel latitude over either a two-piece spacing layer 880 or a frame 606 of FIG. 1, alone. Namely, the routing layer 980 as shown does not add appreciably to the footprint of the stacked device 582, even if the heat sink 780 is omitted.

As shown, routing board 980 has another feature that provides individual signal coupling. Unlike the other conductors 901–911,913–918 comprising contacts of routing layer 980, conductor 912 as shown comprises contacts 991,992 on only one of its surfaces 971,972. A preferred embodiment of the present invention features a routing layer featuring at least one offset conductor 169 constructed by methods known by those skilled in the art. In a preferred embodiment of the present invention, conductors 114 and 214 are no-connects (i.e., package conductors comprising contacts that are not internally connected to the chips' internal circuits) and the chips 180,280 are identical. Thus, as shown, conductor 112 is electrically coupled to exactly one chip 180 and conductor 114 is electrically coupled to exactly one chip 280, a convenient implementation of individual signal coupling.

Also relating to FIG. 7, the upper surface of the heat sink 780 is desirably coated with a dielectric coating to avoid electrically coupling with conductors 168 on the routing layers 980 between the chips 160,260. Materials usable for heat sinks 780 are known in the art, but most are electrically conductive. Alternatively, a spacing layer 880 thick enough to allow clearance below the routing layer 980 (as shown) can be employed in conjunction with a heat sink 780 affixed away from the routing layer 980.

Figure 8:
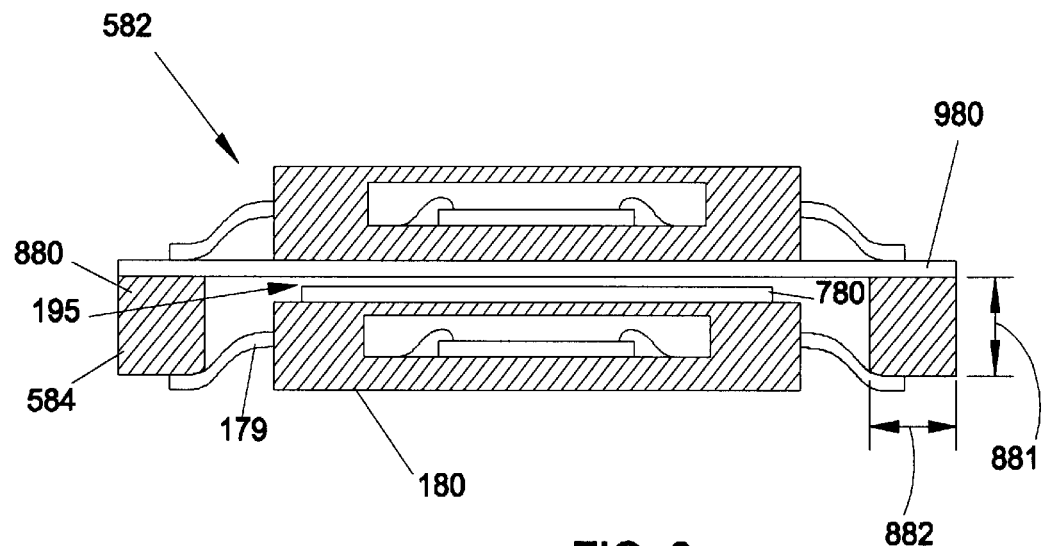
FIG. 8 shows a cross-sectional view of the stacked device of FIG. 7.

FIG. 8 shows a cross-sectional view of the stacked device 582 of FIG. 7. Conductors 168 on the underside of the routing board 980 are electrically separated from the heat sink 780 by a dielectric 195 between the board 980 and the heat sink. If the heat sink is affixed to the bottom chip 180, the dielectric 195 may be an air gap. Otherwise, the dielectric 195 can comprise a coating on a surface of either the heat sink or the board 980. In a planar configuration having externally identical packages, as shown, the spacing segments 584 preferably have a greater thickness 881 than that of one chip 180 plus that of one heat sink 780. As shown in FIGS. 7 & 8, each spacing segment 584 lacks horizontal trace routing has a thickness 881 at least about as large as its width 882.

In another embodiment like that shown in FIG. 8, the body of the lower chip 180 extends lower than the bottom of the leads 179. A primary board can accommodate such chips by providing a recessed portion large enough to admit the body of the lower chip, and is advantageous for accommodating flat package leads, for example (see FIG. 11).

Figure 9:
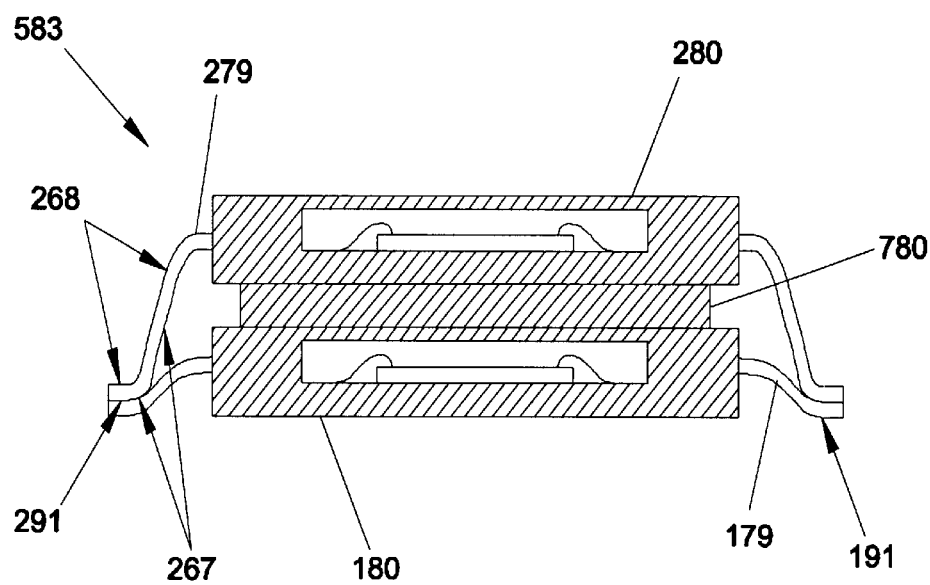
FIG. 9 shows a cross-sectional view of an a lead-on-lead stacked device of the present invention.

FIG. 9 shows a cross-sectional view of stacked device 583 comprising an upper chip 280 having package leads 279 that are longer than the leads 179 of the lower chip 180. Conductors of the upper package 280 comprise leads 279 each having an upper side 268 and a lower side 267. As shown, a portion of the lower side of each lead is a lower external contact 191,291. Variations in the configurations of external leads are well known in the art. In lieu of a routing or spacing layer in the configuration of FIG. 9, lower external contacts 291 of the elongated leads 279 couple directly to an upper external contact 192 of a conductor of the lower package 180. To accommodate larger chips having higher currents (and/or leads on four sides) a larger heat sink 780 is shown. Different lead configurations for internally identical packages are optionally used to some advantage in conjunction with embodiments shown in FIGS. 5–8 & 12–20.

Figure 10:
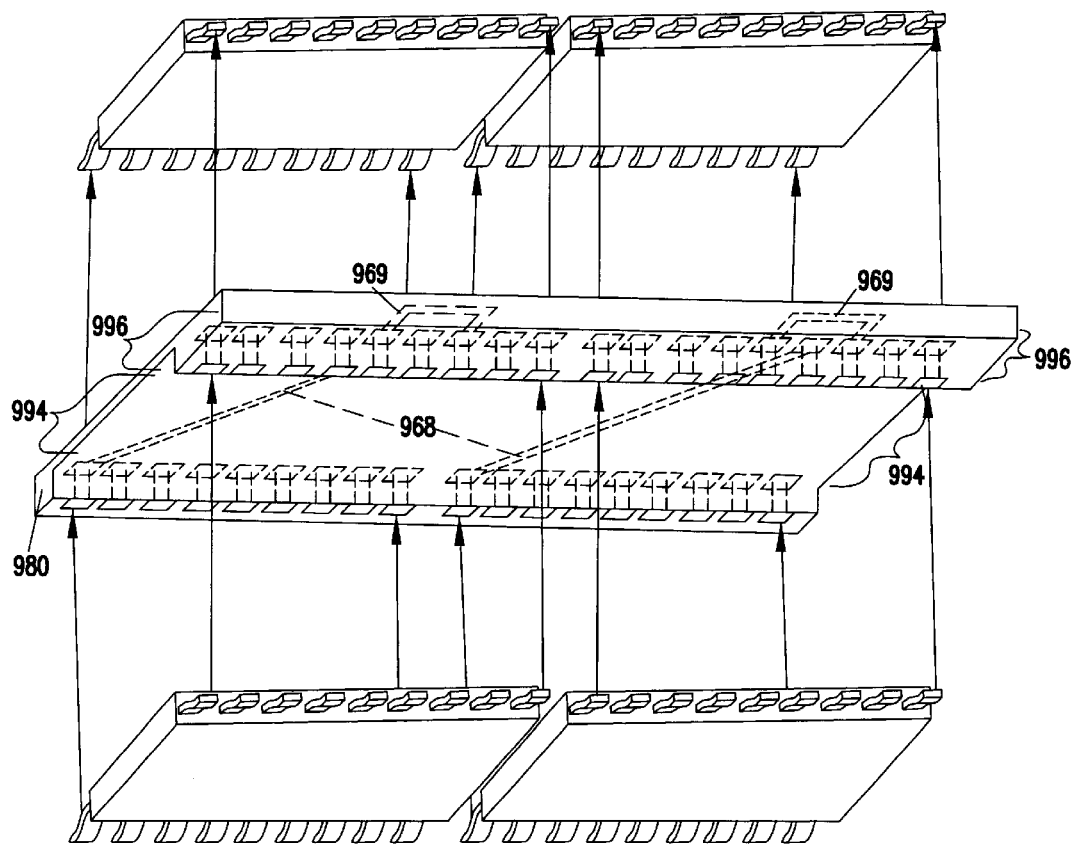
FIG. 10 shows a stacking configuration showing more than one chip per layer, also featuring a single piece routing layer having a widened portion for routing outside the chips' footprints.

FIG. 10 shows a stacking configuration differing from that shown in FIG. 7 in three important features. First, interface 199 comprises a single piece routing layer 980 that also provides spacing between each lower conductor 101–118 and a respective upper conductor 201–218. The routing layer has at least one recessed portion 994 into which at least one chip 180 protrudes. The recessed portion 994 can be bathtub-shaped for a chip 180 having terminals on four sides. Second, each layer of chips 180,280 comprises a plurality of chips. This is a valuable space-saving feature not compatible with some chip stacking systems. Third, the depicted routing layer 980 includes a widened portion 996 wide enough to permit traces 968 that extend outside the footprint of any of the stacked chips 180,280 with at most a minor increase in stacked device footprint size (i.e. less than about 5%). As shown, this widened portion 996 allows at least one trace 969 to be relocated to an outer portion of the layer 980 (i.e., outside the nearest chip's footprint). This, in turn, allows an upper-surface trace 968 to be used in lieu of each lower-surface trace 168 of FIG. 7, removing the necessity for an insulator between the routing layer 980 and the heat sink 780. With minor modifications at most, one of ordinary skill could adapt any of these three features for use with embodiments shown in any of FIGS. 5–7 or 10–13 as described herein.

Figure 11:
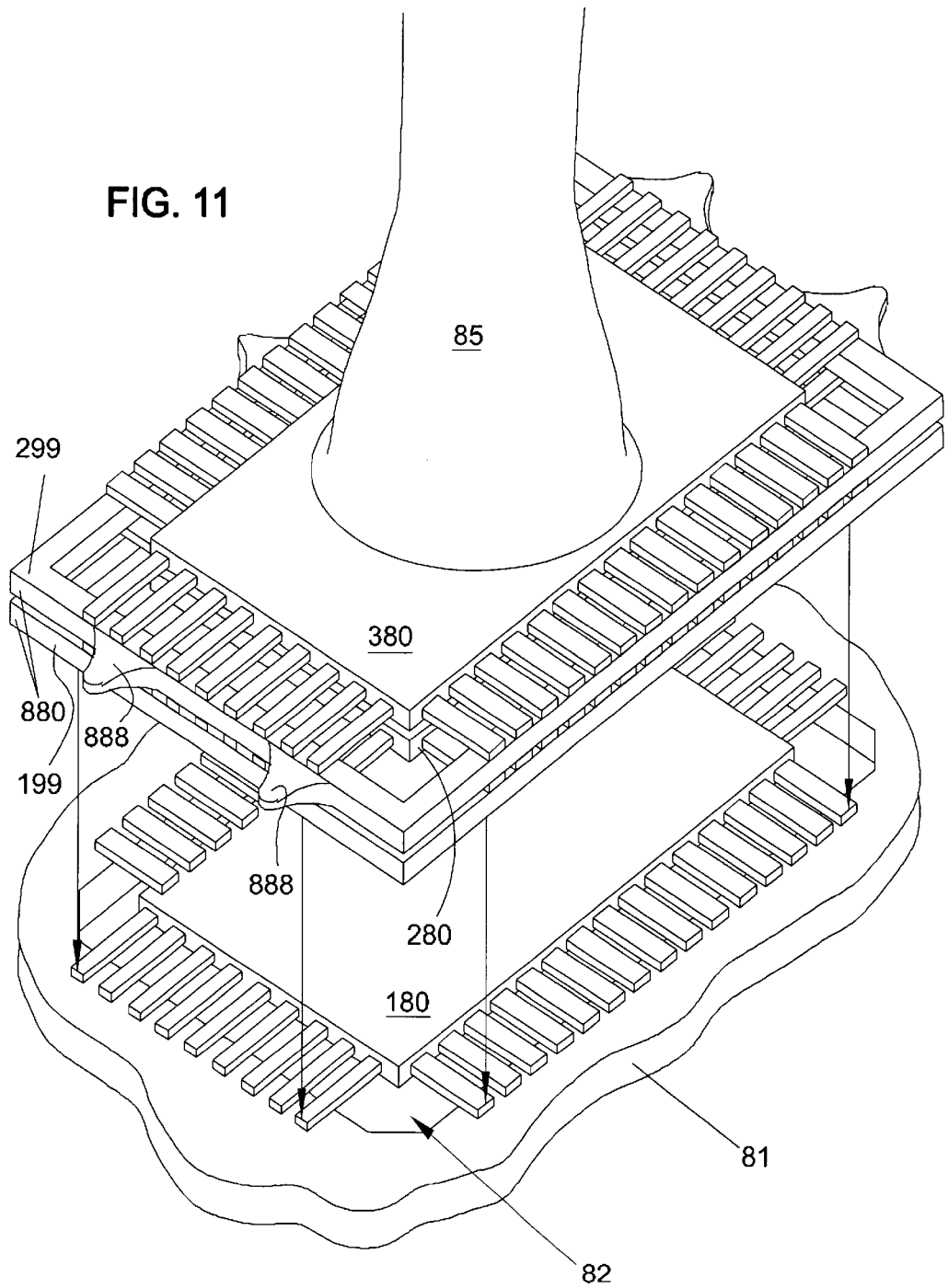
FIG. 11 shows a partially exploded view of an inventive stacked device comprising three chips and two interfaces.

FIG. 11 shows a partially exploded view of a stacked device comprising three chips 180,280,380 and two interfaces 199,299 each comprising a frame-shaped spacing layer 880 fully populated with vertical conductors (not shown). The spacing layer 880 of the upper interface comprises assembly tabs 888 having tapered ends 889. Spacing layers are preferably manufactured in sheets comprising many individual layers 880 joined at their tapered ends, and having reflow paste screen printed to each contact prior to stack assembly. Many bottom chips 180 can be arranged into a grid by robotic assembly equipment, each in a recessed portion 82 of a work surface such that of as a reflow pallet 81. During reflow, the stack is desirably secured and compressed by a downward force applied by a flanged plunger 85 or the like. After reflow, the stacked devices can be singulated by breaking the spacing layers at their tapered ends.

Figure 12:
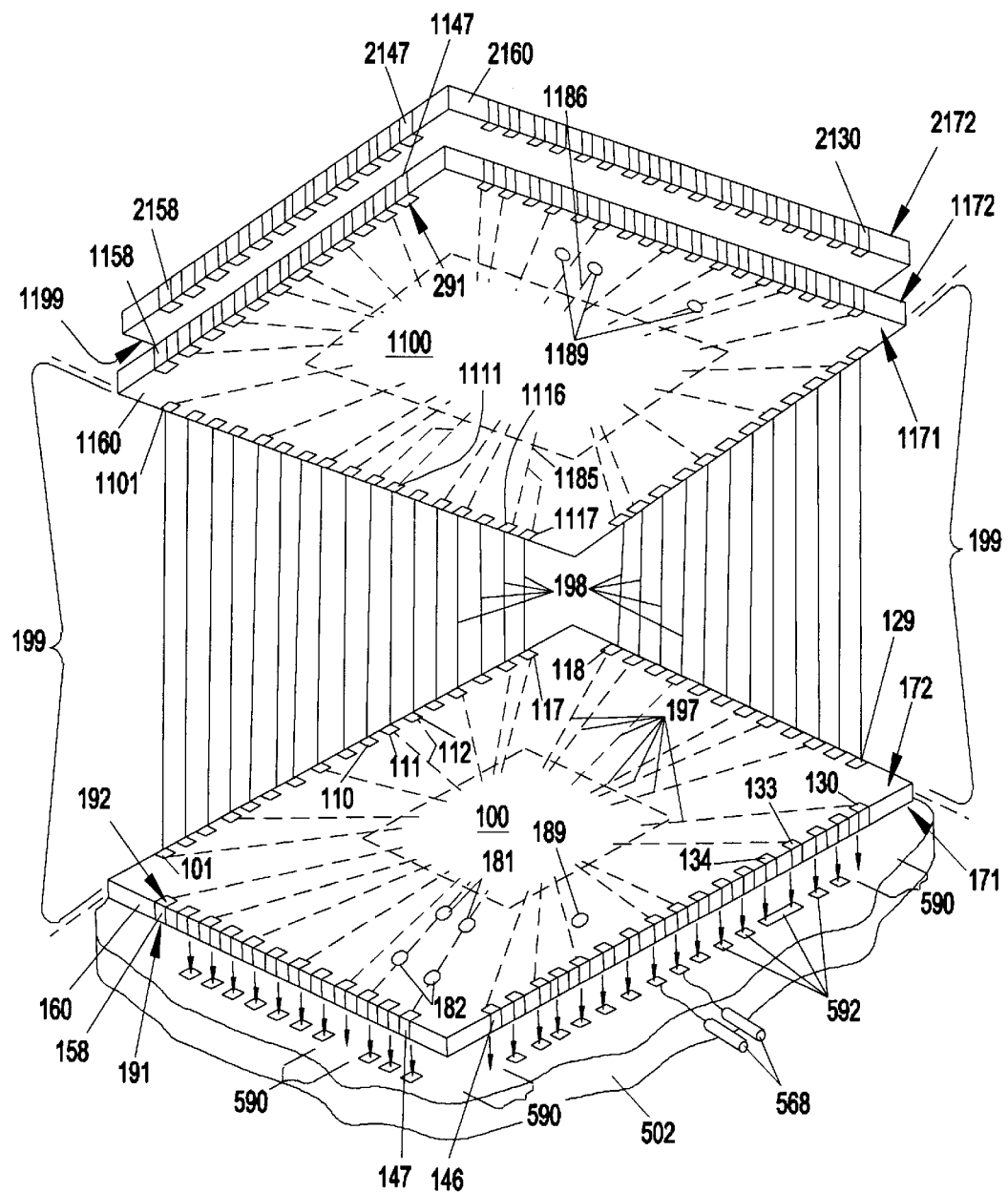
FIG. 12 shows a detailed example of stacked LCC's tilted apart to show their interiors (showing inventive features) and the interfaces between chips (shown generically).

FIG. 12 shows a detailed example of a stacked device mounted on a primary board 502 according to the present invention. In this embodiment, IC dies are packaged in "leadless" chip carrier (LCC) packages 160,260, so named because their conductors 101–158,182,191,192 do not protrude significantly outside the basic shape of the body of the package. In FIG. 12, the bottom LCC package 160 is tilted downward so that its top side 172 is visible. A higher, stacked LCC package 1160 is tilted upward so that its bottom side 1171 is visible, as are half of the 58 external lines 198 (lines "external" to the package, half of which are shown schematically).

In FIG. 12, interface 199 may simply comprise solder between conductor 101 and conductor 1101 and between each of the other 57 matched pairs of conductors of the two lower packages. Optionally, it may include spacing layers and/or heat sinks such as those shown in FIG. 7. Optionally, the present invention includes a second stacked package 2160 identical to the lower packages 160,1160 having 58 open contacts on its top surface 2172. The bottom LCC package 160 contains a die having internal circuitry 100 coupled by several internal lines 197 to respective upper contacts 192 on the package's upper surface 172 and to respective lower contacts 191 on the package's lower surface 171. Each of these internal lines 197 comprises an external contact 181 of the first die and an internal contact 182 of the package, as well as the two external contacts 191,192 of the package. At least half of the lower external contacts 191 each couple directly to a corresponding contact 592 on the primary board 502. As explained below, however, a small number of lower external contacts 191 of the bottom LCC are optionally unconnected, such as by being physically coupled to a dielectric 590 on the primary board 502. Examples are shown below conductors 130,146 & 150. As shown at conductors 146 and 1146 of the present invention, stacking structures of the present invention optionally feature one or more couplings between chip conductors having very low capacative loads by virtue of being electrically isolated from the interior of the board 502 upon which the stacked device is mounted.

Preferably, each package 160,1160 contains at least one unconnected contact 189,1189 outside the internal circuitry 100,1100 of dies inside the package. In a typical case, as explicitly shown for package 1160, either a package conductor 1134 or an internal circuit line 1186 will be electrically coupled to one side of each unconnected contact 1189. Unconnected contacts 189,1189 may be a part of the die (such as a bonding pad to which no bond wire is attached) or a part of the package (such as a bond finger to which no bond wire is attached). As explained below, appropriate use of unconnected contacts allows performance enhancements and ease of manufacture not previously available.

It should be understood that many contacts 181,182,189 inside the package 160 are not shown in FIG. 12, nor are conductors that may couple an unconnected contact 189 electrically to either external contacts 191,192 or to internal circuitry 100. Unconnected contacts 189,1189 and the conductors to which they are attached are commonly called "no-connects" in the art.

Although some of the die contacts 181 may be unconnected contacts 189,289, most of the external die contacts 181 (i.e., available on the exterior of the die) in each package 160 are typically coupled electrically to both the corresponding internal circuitry 100 and to a corresponding package contact 182. In some circumstances, it is advantageous to have one or more internal lines 1185 each coupled electrically to two or more package contacts 1116,1117.

Figure 13:
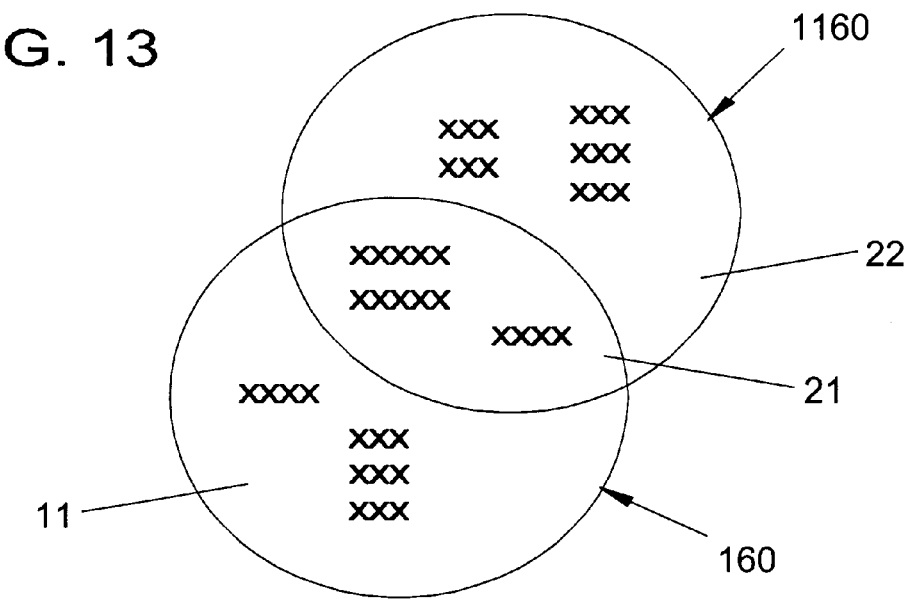
FIG. 13 shows a Venn diagram for ascertaining a suitable package size for a given set of chips to be stacked, especially useful for dissimilar chips.

FIG. 13 shows a Venn diagram for ascertaining a suitable package size for a given set of chips to be stacked, especially useful for less-similar chips. Circles 160,1160 each represent a package and each "x" in a circle represents a conductor extending within a corresponding package. Zone 21 thus contains the conductors that extend into both packages 160,1160. Recalling that fourteen internally connected package conductors 101,108,111,114,117,118,119,125,130,133, 138,146,150,152 are each coupled to a corresponding internally connected package conductor in FIG. 12, these fourteen couplings are each shown as an "x" in intersection zone 21. Similarly, thirteen other connectors coupled to chip 160 but not to chip 1160 are each shown as an "x" in zone 11. A careful review of either FIG. 12 or 13 will thus show that a total of twenty-seven package conductors of chip 160 are internally connected (to internal circuitry 100 within chip 160). As explained above, some aspects of the present invention are directed to individual signal coupling—changing the connectivity of chips 160,1160 initially having "exclusive" zones 11 and 22 empty.

Figure 14:
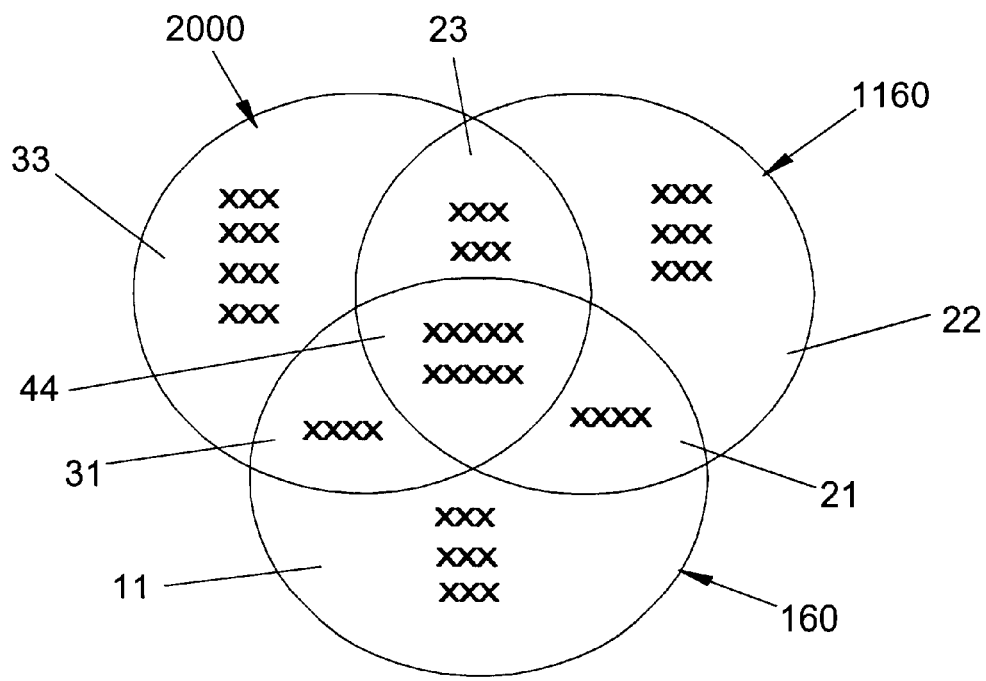
FIG. 14 shows a Venn diagram like that of FIG. 13 adapted for coupling more than two layers.

FIG. 14 shows a Venn diagram like that of FIG. 13 adapted for coupling more than two layers. As shown, FIG. 14 is adapted to show how a stack of three dissimilar chips 160,1160,2160 can be configured in a substantially non-parallel configuration consistent with FIG. 12. As shown, the third circle 2000 represents a top chip 2160. Ten conductors in zone 44 are shared by all three chips, and the zone 21 shared by only the lower chips 160,1160 (excluding the third chip 2160) has only four "composite" conductors. In general, each circle 160,1160,2000 represents either a die or another layer having selectively provided coplanar contacts such as a substrate 502.

Figure 15:
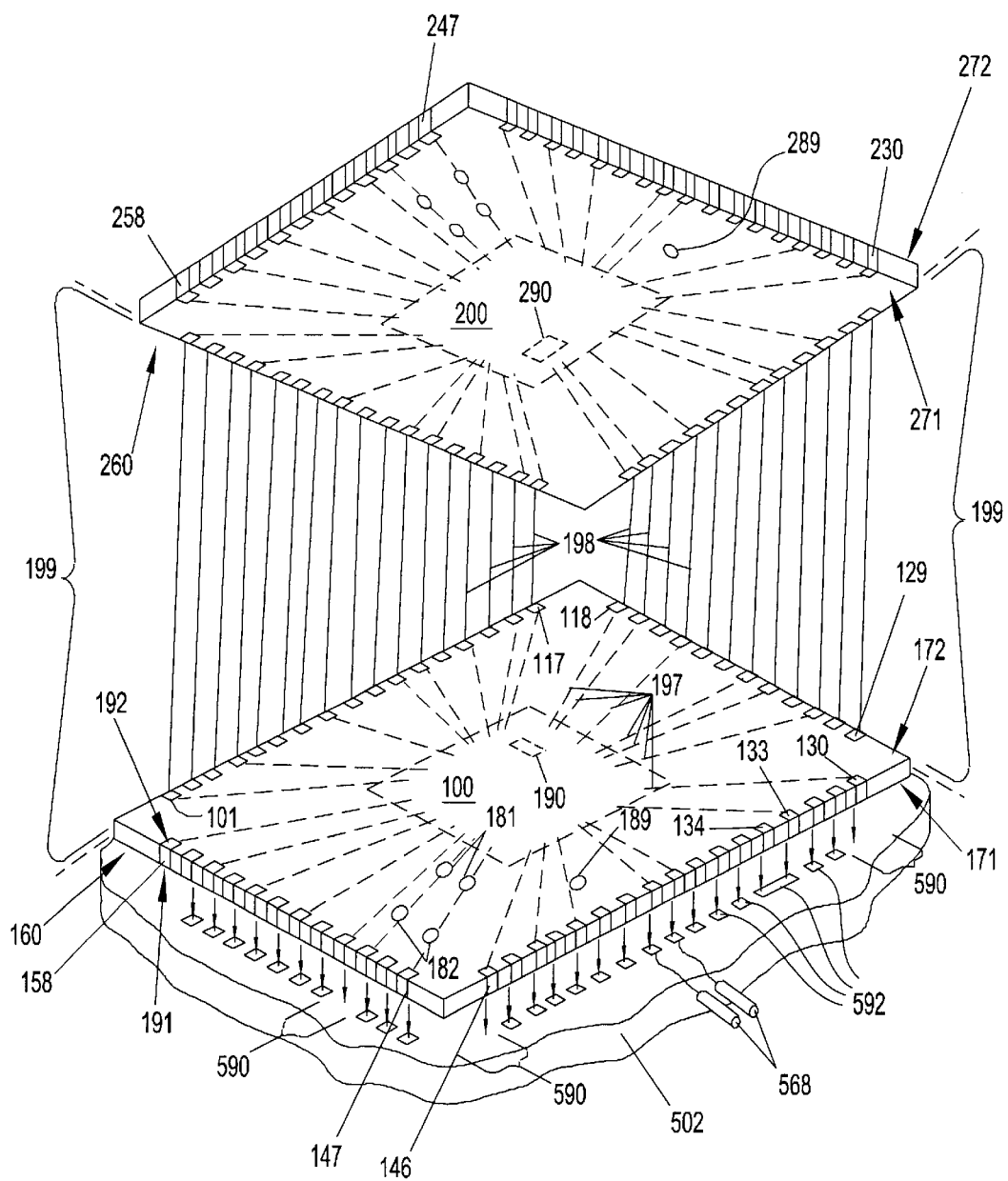
FIG. 15 shows a stacked device of the present invention somewhat similar to that of FIG. 12, showing other features for differentiating substantially identical chips.

FIG. 15 shows a stacked device of the present invention somewhat similar to that of FIG. 12, teaching a chip differentiating approach. Techniques are known for detecting any of the post-fabrication induced chip differences taught herein. With the aid of these teachings, it is merely a matter of design choice for one of ordinary skill to provide suitable internal circuitry responsive to any of these differences. IC die 100 includes a storage cell 190, which can be any of the nonvolatile storage devices known in the art such as a laser-modified element. More preferably, cell 190 comprises an EEPROM or other read-only memory cell or a fusible link. It can also be one or more light-sensitive components on the IC die used in conjunction with a clear IC package cover.

As depicted, die 1100 and package 1160 are substantially identical to die 100 and 160, respectively. In one embodiment, the depicted stacked device can function because the storage cells 190,1190 are configured differently. In another, an unconnected contacts 189,1189 present in one chip is absent in each other chip in the stack.

Figure 16:
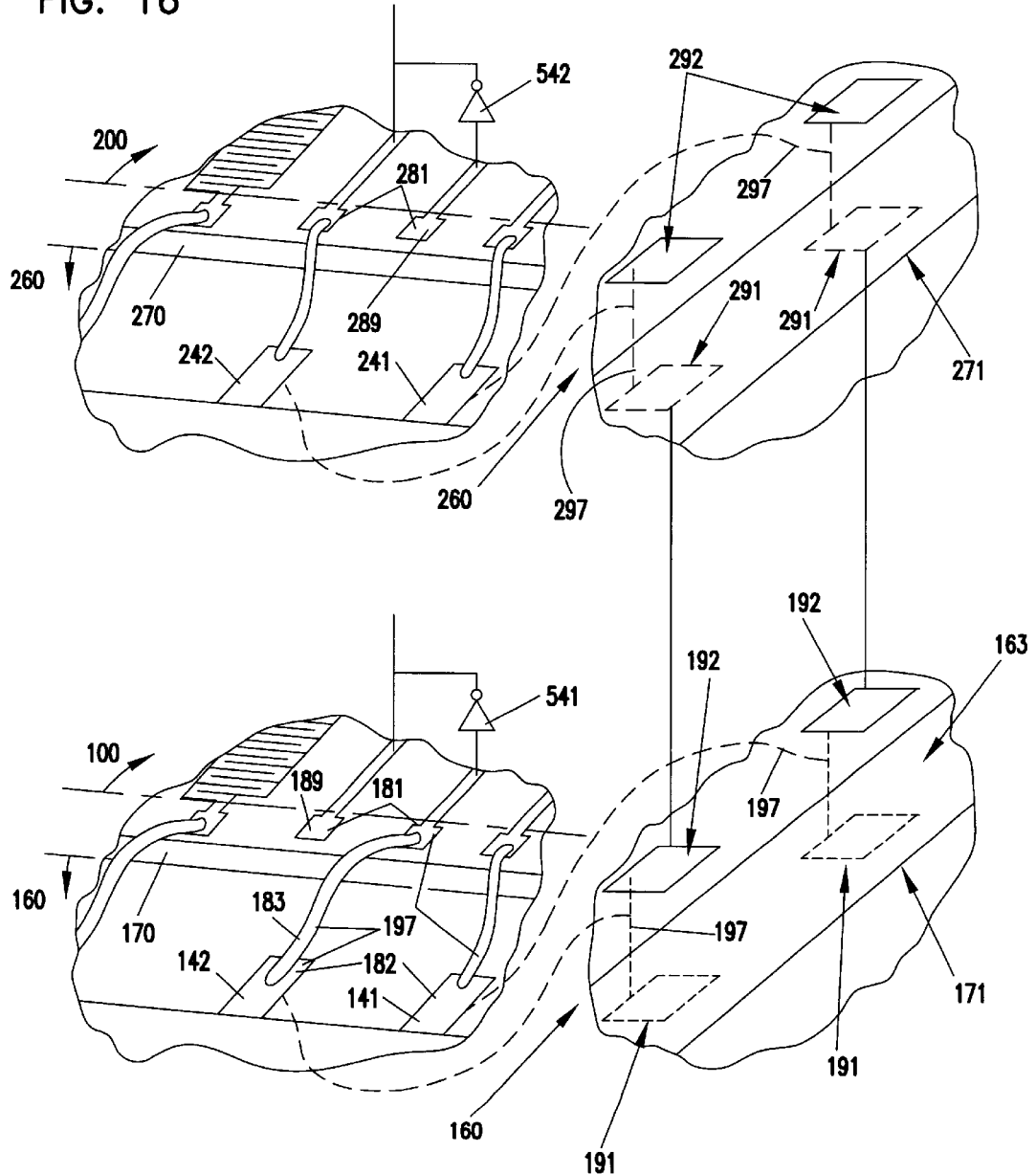
FIG. 16 shows an inventive configuration of in-package conduits and unconnected contacts for individual signal coupling to each chip of a 2-layer stacked device.

FIG. 16 shows an inventive configuration of unconnected contacts 189,289 for individual signal coupling to each chip of a 2-layer stacked device (i.e. one having two layers of chips). It is substantially consistent with FIG. 15 as explained above, but depicts external contacts 191,192 set back from the sides 163 of the packages 160,260. Integrated circuit die 170 having internal circuitry 100 is mounted inside bottom IC package 160. Within the bottom package 160, internal lines 197 each comprises couplings between external contacts 191,192 and internal contacts 182 of the package 160, bond wires 183, contacts 181 on the die 170, and a portion of a signal trace leading into the internal circuitry 100. It can be seen in FIG. 16 that an unconnected contact 189 within the bottom package 160 is electrically coupled to internal circuitry 100, but is otherwise separate from any external contacts 191,192 by a large dielectric gap.

Substantially identical integrated circuit die 270 is similarly mounted inside substantially identical stacked IC package 260, but is connected with a different bond wire configuration. In particular, the unconnected contact 289 on the upper die 270 is not directly above unconnected contact 189 of the identical lower die. Preferably, the two dice 170,270 are identical and are assembled in identical stacked packages 160,260, one die having first and second successive contacts 181 corresponding to identical successive contacts 281 on the other die, one package 160 having an internal contact of conductor 142 coupled to a first contact of the first die, the other package 260 having a corresponding internal contact of conductor 242 coupled to the second contact of the second die. In other words, each of the identical dice 170,270 desirably has an unconnected contact 189,289 that is offset from (i.e., does not correspond to) the unconnected contact 289,189 of the other chip. In a more preferred embodiment, successive contacts 181,281 of two identical dice 170,270 are coupled together through an inverter 541,542 in the internal circuitry of each die.

Figure 17:
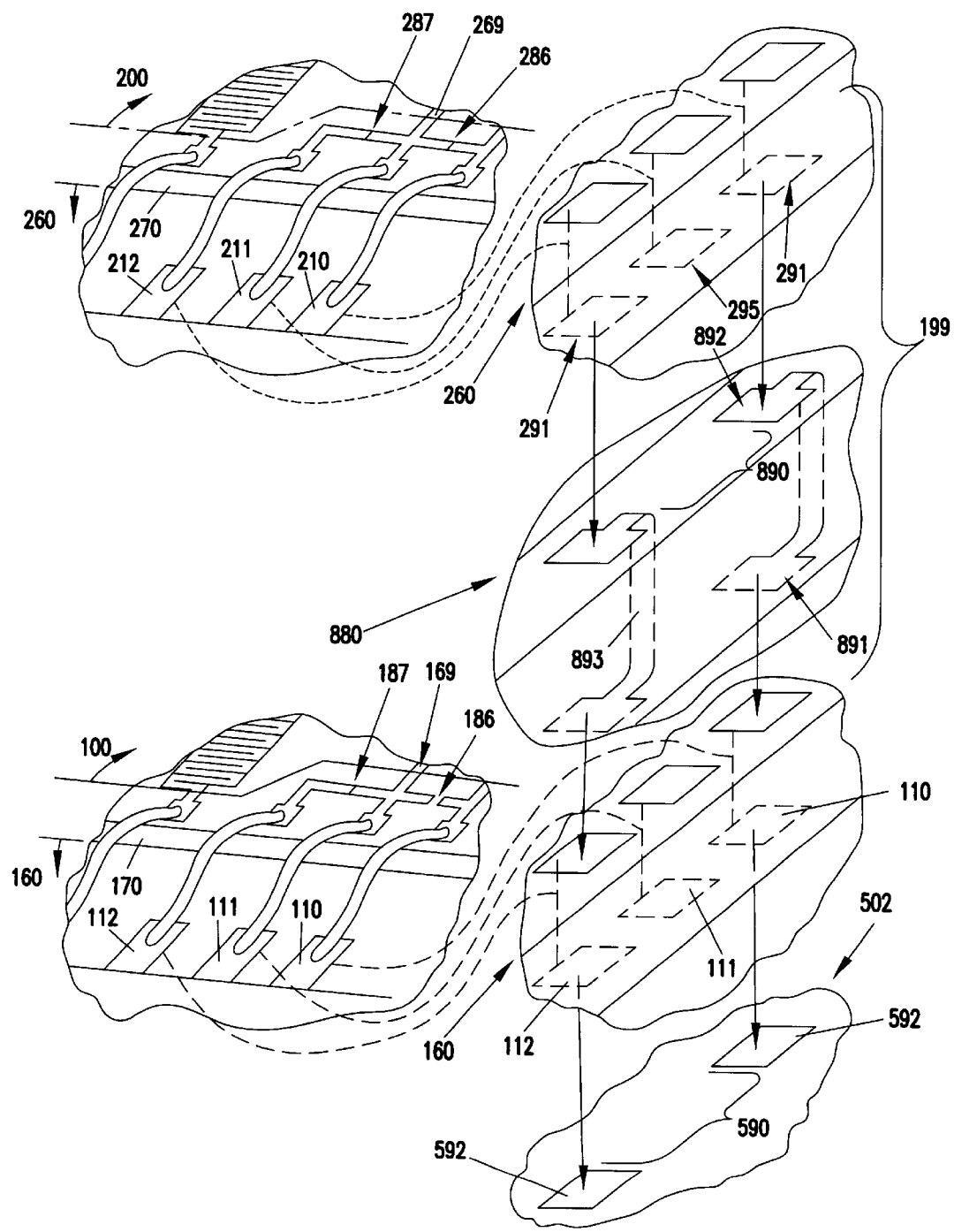
FIG. 17 shows another inventive configuration of unconnected contacts for differentiating the chips of a stacked device, substantially consistent with FIG. 15.

FIG. 17 shows another inventive configuration of unconnected contacts 189,289 for differentiating the chips of a stacked device, substantially consistent with FIG. 15 as explained above. In FIG. 17, the chip interface 199 comprises a spacing layer 880, which allows air flow and/or heat sink structures between packages 160,260. The depicted spacing layer 880 comprises vertical conductors 893 coupling upper contacts 892 each to a lower contact 891. At least some lower contacts 291 of the upper package 260 couple directly to upper contacts 892 of the spacing layer 880. At least one is unconnected, though, directly coupling only to a dielectric region 890 of the spacer 880. As shown, lower contacts 191 of at least some package conductors 110,112 are similarly configured for direct coupling with a primary board 502.

FIG. 17 also shows fusible links 186,187,286,287 which are blown so that each die 170,270 has a different configuration of fused links. In a preferred method of the present invention, all of the identically fabricated IC dice are packaged and electrically coupled identically prior to blowing the links. This facilitates production by reducing the variety of components that must be maintained in inventory, delaying the time at which differences between the upper and lower packaged devices are created. If all-or-nothing links are used, the two shown links can be blown in any of four configurations. Each die has at least one configuration conductor such as a fusible link 186,286 of FIG. 17. At least $\log_2$ L configuration conductors are used, where L is the number of layers in the stack. In FIG. 17, it may be regarded that some package terminals 112,212 have extra links 187, 287 coupled to them, individual signal coupling being achievable with only $\log_2$ 2=one fusible link 186,286 on each die, for a two-layer stack. One embodiment of the present invention thus omits the extra link 187,287 on each die. It is advantageous to have such extra links, however, as the identical dice 170,270 can be packaged and maintained in an inventory without deciding whether they are to be used in stacks of 2, 3, or 4 layers until the stacked device is about to be assembled.

Figure 18:
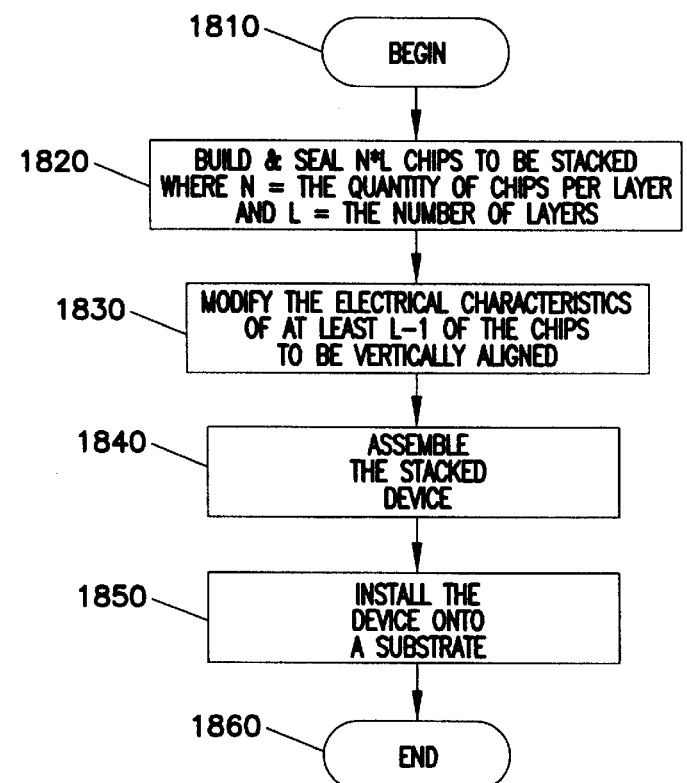
FIG. 18 shows a flowchart of a method of the present invention compatible with FIG. 17.

FIG. 18 shows a flowchart of a method of the present invention compatible with FIG. 17. Chips to be stacked are built 1820 with a nonvolatile configuration element. This can be a cell 190 as discussed above with reference to FIG. 15, a fusible link 186 as explained above with reference to FIG. 17, or a similar item known in the art. Preferably, the selected element is of a type that is readily modified without mechanical operations such as bending, soldering, or cutting. Many nonvolatile elements responsive to solid state programming methods are available, as already discussed.

The internal chip characteristics are modified 1830 and the stacked device is assembled 1840 as described above. In one embodiment, package conductors having a side contact (such those depicted in FIGS. 7–12) in a stack of more than three layers of substantially identical chips.

Referring back to FIG. 17, a programming conductor 111,211 for each of the packages 160,260 is shown. A preferred embodiment of the present invention provides side contacts for programming conductors (the construction of such side contacts being known in the art). Side contacts can be used in lieu of top or bottom contacts to provide access to a programming line on only one package at a time, or with a spacing layer having a dielectric zone 890 such as that of FIG. 17. For a stack of several layers of substantially identical chips, modifying step 1830 of FIG. 18 preferably comprises differentiating the chips in each vertically aligned set using such programming conductors.

In another embodiment, three identical chips are stacked with spacing layers exactly consistently with FIG. 17 (the second spacer layer and third stacked chip not shown). A stacked device of this embodiment is desirably stacked (assembled) 1840 before the internal chip characteristics are modified 1830. Advantageously, this removes the necessity of tracking which chip is which until after the stacks are assembled. The bottom die 170 is differentiated from the others 270,370 by providing a large current between conductors 110 & 111, thus blowing link 186. The top die 370 is differentiated from the others 170,270 by blowing a link coupled to package conductor 312. After at least part of the chip differentiation 1830 and the assembly 1840, the stacked device is ready to be installed 1850 onto a substrate.

Figure 19:
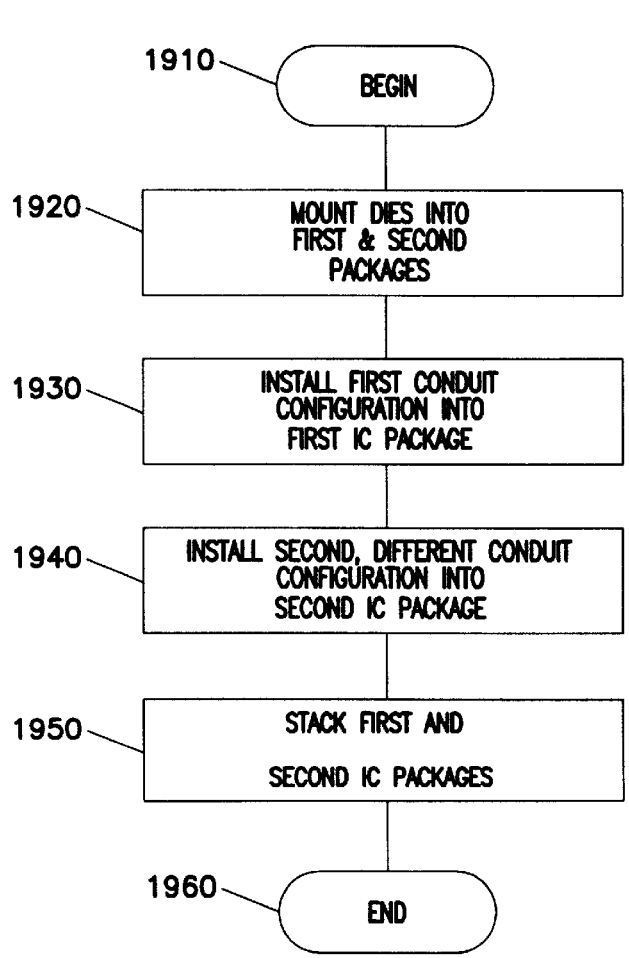
FIG. 19 shows another flowchart of the present invention compatible with FIGS. 15, 16 & 20.
Figure 20:
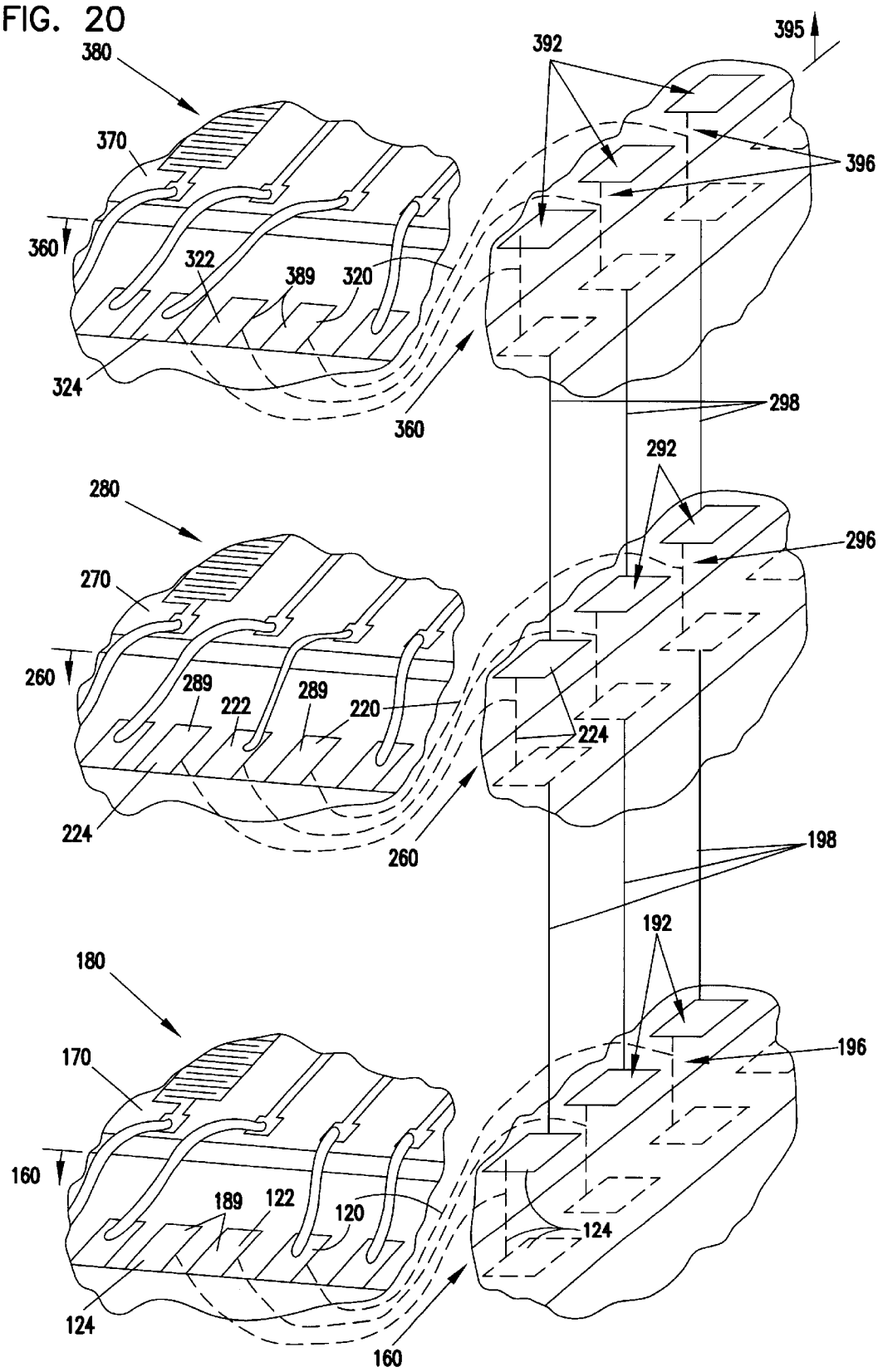
FIG. 20 shows several unconnected contacts in a configuration of the present invention compatible with FIG. 19 in a 3-layer stack.

FIG. 19 shows another flowchart of the present invention compatible with FIGS. 15, 16 & 20. Dies are mounted into packages 1920 without being differentiated, thus taking partial advantage of the principle of commonality. A first conduit configuration is used for installing conduits into the first package 1930 to couple the necessary contacts of the first die. For installing conduits into the second package 1940, a second conduit configuration different from the first is used, thus differentiating the chips. After these installations, the IC chips are stacked 1950.

FIG. 20 shows several unconnected contacts 189,289,389 in a configuration of the present invention compatible with FIG. 19 as described above, in a 3-layer stack. Integrated circuit dice 170,270,370 are packaged inside respective integrated circuit packages 160,260,360. Upper external contacts 392 of the topmost chip 380 are all physically separated from one another by dielectric gaps 396 and a complete dielectric cover 395 such as air or a deposited coating 585 like that shown in FIGS. 4 & 5. Upper external contacts 192,292 of lower chips 180,280 are likewise separated by dielectric gaps 196,296, but have external lines 198,298 displacing at least part of any corresponding dielectric covering.

All of the steps and structures described above will be understood to one of ordinary skill in the art, and would enable the practice of the present invention without undue experimentation. It is to be understood that even though numerous characteristics and advantages of various embodiments of the present invention have been set forth in the foregoing description, together with details of the structure and function of various embodiments of the invention, this disclosure is illustrative only. Changes may be made in the details, especially in matters of structure and arrangement of parts within the principles of the present invention to the full extent indicated by the broad general meaning of the terms in which the appended claims are expressed. For example, the particular elements may vary depending on the particular application for the present system while maintaining substantially the same functionality, without departing from the scope and spirit of the present invention. In addition, although the preferred embodiments described herein are largely directed to increasing the areal density of PCB's and the simplifying the manufacture of components for stacked devices, it will be appreciated by those skilled in the art that the teachings of the present invention can be applied to improve other performance aspects without departing from the scope and spirit of the present invention.

To summarize a method of the present invention, a layer of chip(s) 280,380 is placed directly on the floor 81,82,83 of an assembly fixture. A spacing and/or routing layer 584,880 is placed directly on the contacts 291,292 of the chip(s), and an additional layer of chip(s) 180,280 is placed directly on the layer 584,880. After bonding the layers such as by solder reflow 1265, the stacked device 580 made by the method is optionally tested 1270 before removal from the fixture.

Another method comprises mounting dies 170,270 (which may be similar or identical) into packages 160,260 (which may also be similar or identical). The chips 180,280 made by this method are differentiated either by installing a different configuration of conduits 1940 (e.g. bond wires 183 and no-connects 189) into each or by otherwise modifying their electrical characteristics 1830 (such as by blowing a link 186 or by programming a cell 190). Installing steps 1930,1940 may differ by simply having one no-connect 189 horizontally offset from another 289.

In another method, a substrate 503 is built having many conductive contacts 592 and many internal traces 568. A stacked device 580,582 is assembled with several substantially coplanar conductive contacts 191. Some of the device contacts 191 are physically coupled to contacts 592 on the substrate, but at least one of the device contacts 191 is electrically isolated from all of the internal traces 568, such as by providing a dielectric region 590 coplanar with the substrate contacts 592 and aligned with at least one device contact 191.

Devices made by each of these methods or having this recited structure are also embodiments of the present invention. One such device includes top and bottom rectangular packages 160,260 each having gull-wing leads protruding outward and downward from at least two sides. A means for physically coupling the leads is provided as taught above, optionally comprising two elongated printed circuit board (PCB) segments 584 between the leads of the top and bottom packages. A means for electrically coupling the leads is likewise taught, optionally including one or more horizontal circuit traces within the PCB segments 584.

What is claimed is:

1. A method of stacking chips by positioning at least two chip layers into an assembly fixture comprising a floor, each layer comprising at least one chip, the method comprising steps of:

(a) positioning a first chip layer directly on the floor;
   (b) positioning a first spacer layer on the first chip layer;
   (c) positioning at least one additional chip layer over the spacer layer;
   (d) coupling the layers together; and
   (e) removing the coupled layers from the assembly fixture, the coupled layers comprising at least one stacked device.

2. A stacked device made by the method of claim 1.

3. The method of claim 1, in which at least one of the chip layers comprises a package, and at least one of the chips is mounted within the package.

4. The method of claim 1, in which the first spacer layer is generally rigid.

5. A method of stacking similar, packaged first and second dies comprising steps of:

(a) mounting at least one of the first dies into a first package;
   (b) installing several electrical conduits into the first package in a first conduit configuration;
   (c) mounting at least one of the second dies into a second package;
   (d) installing several electrical conduits into the second package in a second conduit configuration different from the first configuration; and
   (e) electrically coupling the first package to the second package to form a stacked device.

6. The method of claim 5 in which only one of the first dies is stacked with only one of the second dies, the first and second dies being substantially identical, each die having internal circuitry and a set of a nominal contact locations relative to the circuitry, the first set of nominal locations containing the second set of nominal locations; in which each package has an interior, each interior and each die including several contacts; in which each of the conduits is a bond wire coupling one of the die contacts to one of the interior contacts; in which installing steps (b) and (d) each comprise a step of coupling several bond wires each directly to one of the die contacts and to one of the interior contacts; in which installing step (b) results in a first set of contacts being electrically coupled that define the first conduit configuration; and installing step (d) results in a second set of contacts being electrically coupled that define the second conduit configuration.

7. A stacked device made by the method of claim 5.

8. The method of claim 5 in which mounting step (c) is completed before the installing step (d) is completed.

9. The method of claim 5 in which at least one of the electrical conduits comprise a bond wire.

10. The method of claim 5 in which coupling step (e) further comprises a step of:

(e1) electrically coupling the electrical conduits in the first package with the electrical conduits in the second package.

11. A method of making a stacked device comprising at least a first integrated circuit (IC) die and a second IC die, comprising steps of:

(a) building a first IC chip by installing the first die in a first package;

(b) building a second IC chip by installing the second die in a second package, the second die being identical to the first die, the second package being internally identical to the first package;

(c) sealing the packages;

(d) modifying the electrical characteristics of at least one of the chips; and (e) electrically coupling the first chip to the second chip to form a stacked device.

12. The method of claim 11 in which the modifying step (d) comprises blowing at least one fusible link that resides on at least one of the dies.

13. The method of claim 11, in which modifying step (d) is performed prior to coupling step (e).

* * * * *